(12) United States Patent
Nellissen et al.

(10) Patent No.: US 6,240,621 B1
(45) Date of Patent: *Jun. 5, 2001

(54) METHOD OF MANUFACTURING A PLURALITY OF ELECTRONIC COMPONENTS

(75) Inventors: Antonius J. M. Nellissen; Erik C. E. van Grunsven, both of Eindhoven (NL)

(73) Assignee: U.S. Philips Corporation, New York, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/128,837

(22) Filed: Aug. 4, 1998

(30) Foreign Application Priority Data

Aug. 5, 1997 (EP) ................................... 97202432

(51) Int. Cl.$^7$ ....................................................... H01F 7/06
(52) U.S. Cl. ........................... 29/602.1; 29/593; 29/25.42; 361/304
(58) Field of Search ................. 29/602.1, 25.42, 29/593, 852; 361/306.1, 310, 309, 304

(56) References Cited

U.S. PATENT DOCUMENTS

| | | | |
|---|---|---|---|
| 3,770,434 | * 11/1973 | Law | 96/36.1 |
| 3,809,973 | * 5/1974 | Hurley | 317/258 |
| 4,356,529 | * 10/1982 | Kopel | 361/304 |
| 4,453,199 | * 6/1984 | Richie et al. | 361/306 |
| 4,486,738 | * 12/1984 | Sadlo et al. | 338/320 |
| 4,788,523 | * 11/1988 | Robbins | 338/309 |
| 5,144,527 | * 9/1992 | Amano et al. | 361/321 |
| 5,228,188 | * 7/1993 | Badihi et al. | 29/623 |
| 5,278,012 | * 1/1994 | Yamanaka et al. | 430/30 |
| 5,295,289 | * 3/1994 | Inagaki et al. | 29/25.42 |
| 5,366,920 | * 11/1994 | Yamamichi et al. | 437/52 |
| 5,406,446 | * 4/1995 | Peters et al. | 361/306.1 |
| 5,414,589 | * 5/1995 | Amano et al. | 361/306.3 |
| 5,493,769 | * 2/1996 | Sakai et al. | 29/593 |
| 5,529,831 | * 6/1996 | Waga et al. | 428/209 |
| 5,561,587 | * 10/1996 | Sanada | 361/306.1 |
| 5,625,220 | * 4/1997 | Liu et al. | 257/530 |

(List continued on next page.)

FOREIGN PATENT DOCUMENTS

WO9630916    10/1996 (WO) .............................. H01G/4/33

*Primary Examiner*—Gregory L. Huson
*Assistant Examiner*—Minh Trinh
(74) *Attorney, Agent, or Firm*—Steven R. Biren

(57) ABSTRACT

A method of manufacturing a plurality of thin-film, surface-mountable, electronic components, comprising the following successive steps: providing a substantially planar, ceramic substrate having a first and second major surface which are mutually parallel, the substrate containing a series of mutually parallel slots which extend from the first major surface through to the second major surface, such slots serving to subdivide the substrate into elongated segments extending parallel to the slots and located between consecutive pairs thereof, each segment having two oppositely located walls extending along the edges of the adjacent slots, each segment carrying a thin-film electrode structure on at least one of its first and second major surfaces; with the aid of a three-dimensional lithographic technique, providing electrical contacts which extend along both walls of each segment and which make electrical contact with the electrode structure on each segment; severing the segments into individual block-shaped components by severing them along a series of division lines extending substantially perpendicular to the walls of each segment. This method can be used to manufacture various types of component, such as thin-film resistors, fuses, capacitors and inductors, but also passive networks, such as RC and LCR networks.

8 Claims, 7 Drawing Sheets

U.S. PATENT DOCUMENTS

| | | | | |
|---|---|---|---|---|
| 5,639,686 | * | 6/1997 | Hirano et al. | 437/189 |
| 5,699,607 | * | 12/1997 | McGuire et al. | 29/612 |
| 5,712,759 | * | 1/1998 | Saenger et al. | 361/321.4 |
| 5,738,977 | * | 4/1998 | Van Der Sluis-Van Der Vootrt et al. | 430/313 |
| 5,799,379 | * | 9/1998 | Galvagni et al. | 29/25.42 |
| 5,853,515 | * | 12/1998 | Sano et al. | 156/89.16 |
| 5,880,925 | * | 3/1999 | Dupre' et al. | 361/303 |
| 6,001,702 | * | 12/1999 | Cook et al. | 438/393 |

* cited by examiner

METHOD OF MANUFACTURING A PLURALITY OF ELECTRONIC COMPONENTS

BACKGROUND OF THE INVENTION

The invention relates to a method of manufacturing a plurality of thin-film, surface-mountable, electronic components. Examples of such components include resistors, capacitors, inductors and fuses, but also passive networks, such as RC and LCR networks.

Such a method is known, for example, from U.S. Pat. No. 4,453,199, which relates specifically to the manufacture of a plurality of thin-film capacitors. The method therein described employs a glass plate as a substrate. Using masking techniques, an orthogonal matrix of discrete, thin-film electrode structures is provided on a major surface of this plate, with the aid of a sputtering or evaporation procedure, for example. Each such electrode structure comprises a bottom and top electrode layer, which are separated by an interposed insulator layer, the electrode layers being offset in such a manner that they only partially overlap one another. After provision of the electrode structures, the plate is cut into strips, each such strip carrying a linear array of electrode structures. Each strip is cut in such a manner that the bottom electrodes all terminate at a first long edge of the strip, but not at the oppositely situated second long edge, whereas the top electrodes all terminate at the second long edge of the strip, but not at the oppositely situated first long edge. Each strip is then provided with an electrical contact along its first and second long edges, using a technique such as sputter-coating. Once these contacts have been provided, the strip is cut into individual block-shaped components, each comprising an electrode structure and two electrical contacts.

The method described above has a serious disadvantage, in that the plate must be cut into strips before the electrical contacts can be provided. This is undesirable, because it means that the manufacturing process cannot be completed at plate level (being the most efficient and economic mass-production scenario), and must instead be completed on a relatively piecemeal basis using sub-units of the original substrate plate (which is more time consuming, and therefore expensive).

SUMMARY OF THE INVENTION

It is an object of the invention to alleviate this drawback. In particular, it is an object of the invention to provide an economic and efficient method of manufacturing a plurality of electronic components. More specifically, it is an object of the invention to provide a component-manufacturing method which allows the entire component to be completed at plate level, before the substrate is severed.

These and other objects are achieved according to the invention in a method as specified in the opening paragraph, characterized in that it comprises the following successive steps:

a) providing a substantially planar ceramic substrate having a first and second major surface which are mutually parallel, the substrate containing a series of mutually parallel slots which extend from the first major surface through to the second major surface, such slots serving to subdivide the substrate into elongated segments extending parallel to the slots and located between consecutive pairs thereof, each segment having two oppositely located walls extending along the edges of the adjacent slots, each segment carrying a thin-film electrode structure on at least one of its first and second major surfaces;

b) with the aid of a lithographic technique, providing electrical contacts which extend along both walls of each segment and which make electrical contact with the electrode structure on each segment;

c) severing the segments into individual block-shaped components by severing them along a series of lines extending substantially perpendicular to the longitudinal direction of each segment.

The method according to the invention employs a number of special techniques to achieve the goals stated above. In particular, the ceramic substrate in step (a) is subdivided into strip-like segments (which remain attached to one another) before provision of the electrical contacts, but is only actually severed into loose block-like components (which are fully separated from one another) after provision of the electrical contacts. Such subdivision allows the use of three-dimensional lithographic techniques to provide the electrical contacts on the exposed side walls of all the segments together (i.e. at plate level), without having to first physically sever the segments from one another (as in the prior art method). Such 3-D lithography will be discussed in more detail herebelow.

The term "ceramic" as employed throughout this text is intended to have a broad scope, and should be interpreted as including the following categories of (electrically insulating) materials:

Abrasives, such as alumina, silicon carbide and diamond;
Refractories, such as silica, quartz, aluminosilicate, magnesite and zirconia;
Vitreous materials, such as glass, glass ceramics and enamels;
Engineering ceramics, such as cermets and ceramic composites, together with various other oxides, carbides and nitrides.

In particular, the generic term "glass" includes various specific types of glass, such as soda glass, borosilicate glass, flint glass, quartz glass, etc.

Step (a) of the method according to the invention can be realized in different manners. On the one hand, the slots can be created in a ceramic plate before provision of the electrode structure. On the other hand, the electrode structure can be provided on a ceramic plate before creation of the slots.

A particular embodiment of the method according to the invention is characterized in that the slots in step (a) are formed by locally powder-blasting a continuous ceramic plate (on which the electrode structure may or may not already be present). This can, for example, be achieved by making a mask which contains apertures corresponding to the slots which are to be formed, and then powder-blasting the plate through the apertures until such time as the slots thus formed extend right through the plate. The mask thus used may, for example, take the form of a removable grid which is placed on the ceramic plate, or it may be a lithographic mask which is created on the surface of the ceramic plate by lamination, exposure and development of a curable resist.

An alternative embodiment to that in the previous paragraph is characterized in that the slots in step (a) are formed by:

attaching at least one rigid support strip across the width of a continuous ceramic plate (on which the electrode structure may or may not already be present);
cutting slots through the ceramic plate, which slots extend into, but not through, the support strip.

The cutting operation may be performed using a wire saw or laser beam, for example. In this embodiment, the integrity of the ceramic plate is maintained by the presence of the rigid support strip, which may be comprised of a material such as metal or ceramic, for example.

The inventive method lends itself to the manufacture of different types of component. For example:

(i) In a particular embodiment, the electrode structure in step (a) is comprised of a single thin film of conductive material which extends between both walls of each segment; the resulting component can then be employed as a thin-film resistor or fuse;

(ii) An alternative embodiment is characterized in that the electrode structure in step (a) successively comprises:
an underlayer of conductive material which extends to a first wall of each segment, but not the second wall;
a layer of insulating material which covers the underlayer;
an overlayer of conductive material which extends to the second wall of each segment, but not the first wall.

In this case, the resulting component can be employed as a thin-film capacitor. If so desired, it is possible to make a variant of this design, in which several layers of conductive materials are arranged in a stack in such a manner that alternate layers extend to alternate walls of each segment; in this manner, a multilayer capacitor is realized.

(iii) Another embodiment is characterized in that each component is a seriesconnected capacitor pair, and that the electrode structure in step (a) comprises:
an underlayer of conductive material;
an intermediate layer of insulating material;
an overlayer of conductive material,
each of these layers being applied so as to cover substantially the entire surface of each segment.

(iv) Yet another embodiment is characterized in that each component is an inductor, and that the electrode structure in step (a) comprises:
an underlayer of conductive material, the layer having the form of a linear array of cells arranged in the longitudinal direction along each segment, each cell comprising a strip which is coiled into a spiral form, a first end of the strip extending to a first wall of the segment and the second end of the strip lying in the middle of the spiral;
an intermediate layer of insulating material, the layer being provided with a via connection through to the second end of the strip in the underlayer;
an overlayer of conductive material, the layer having the form of a linear array of cells arranged in the longitudinal direction along each segment and in registry with the cells of the underlayer, each cell comprising a strip which runs from the via connection in the intermediate layer and to the second wall of the segment, Embodiment (ii) in the previous paragraph can be realized with the aid of a method such as that described in International Patent Application WO-A 96/30916 (PHN 15.692). The basis of such a method is that, if a collimated depository beam of material is directed at the substrate in such a manner that the beam subtends an acute angle with the substrate's normal and is perpendicular to the long edge of the segments in the substrate, then the body of each segment will cast a "shadow" on the segment-wall "downwind" from the depository flux; in this shadow, no deposition of material will occur; e.g. if the beam is directed toward the first wall of each segment, then the second wall of each segment will receive no depository flux.

The (three-dimensional) lithographic technique referred to in step (b) generally involves a procedure such as that described in the following steps:

I. application of a curable photoresist to the substrate resulting from step (a);

II. selective curing of localized regions of photoresist, such curing being performed by irradiating the substrate from more than one side with actinic radiation, the irradiation occurring through a mask;

III. selectively dissolving away portions of resist, using an appropriate developer;

IV. providing a relatively thick metallic layer on all portions of the segments not covered by resist (e.g. using an electroless or galvanic procedure);

V. removing the remaining portions of resist, using an appropriate stripper.

A number of remarks can be made about this procedure, as follows:

The irradiation referred to in step II can be achieved in a number of ways. For example:
in a particular embodiment, radiative access to the walls of the segments and to the first major surface is achieved by irradiating the substrate at an acute angle with respect to its normal, whereas radiative access to the second major surface is achieved by placing a reflective surface (mirror) at the side of the substrate remote from the radiation source and using that reflective surface to direct radiation towards the second major surface;
alternatively, one can directly irradiate the substrate from both sides; radiative access to the second major surface is then achieved without requiring the use of a reflective surface;

The curable photoresist applied in step I above may be a negative or positive photoresist. In the case of a positive photoresist, irradiated (exposed) portions of resist are removed in step III. On the other hand, in the case of a negative photoresist, non-irradiated (unexposed) portions of resist are removed in step III;

Because of the relatively complex form of the substrate resulting from step (a), a particularly advantageous method of performing step I is to use electrophoretic deposition. In that case, the substrate must have a metallized surface before step I can be enacted. If necessary, this can be realized/supplemented by sputter-coating a thin metallic layer onto the (bare ceramic) substrate.

Various scenarios can be achieved in step (b) as regards the positioning and plurality of the electrical contacts. For example:

A) the electrical contacts created in step (b) can be positioned directly opposite one another on opposite walls of each segment, so that the electrical contacts lie along straight alignment axes extending substantially perpendicular to the longitudinal direction of the segments. If the division lines in step (c) are thus positioned that, between any adjacent pair of division lines, there is only one alignment axis, then the resulting component will have two terminals, viz. one on each of two oppositely located sides of a block-shaped ceramic body;

B) if the division lines in case (A) are thus positioned that, between any adjacent pair of division lines, there is a plurality n of alignment axes (n>1), then the resulting component will have 2n terminals, viz. n terminals on each of two oppositely located sides of a block-shaped ceramic body;

C) if the separation of the electrical contacts on one wall of each segment is different to the separation of the electrical contacts on the other wall, then it is possible to create components having uneven numbers of terminals. For example, if, between each adjacent pair of division lines, there are two electrical contacts on the first wall of each segment and only one electrical contact on the other wall, then each resulting component will have three terminals.

Scenarios (B) and (C) thus allow the creation of multi-terminal components such as passive arrays (RC, LCR, LC networks, etc.)

The severing step (c) in the inventive method can be performed in a number of different manners, which are generally known in the art and include methods such as sawing, dicing, brealing along score lines and laser cutting, for example.

If so desired, any number of supplementary steps may be performed at any point in the inventive method. For example, one may conceive:
the deposition of a galvanic seed layer or adhesion promoting layer between steps (a) and (b);
a resist removal procedure or (partial) etching operation between steps (b) and (c);
the deposition of a protective layer on (parts of) the component resulting from step (c), among many other possibilities.

BRIEF DESCRIPTION OF THE DRAWINGS

The invention and its attendant advantages will be further elucidated using exemplary embodiments and the accompanying schematic drawings, whereby.

Corresponding features in the various Figures are denoted by the same reference symbols.

DESCRIPTION OF THE PREFERRED EMBODIMENTS

Embodiment 1

FIGS. 1–7 refer to a particular embodiment of the method according to the invention.

Figure 1:
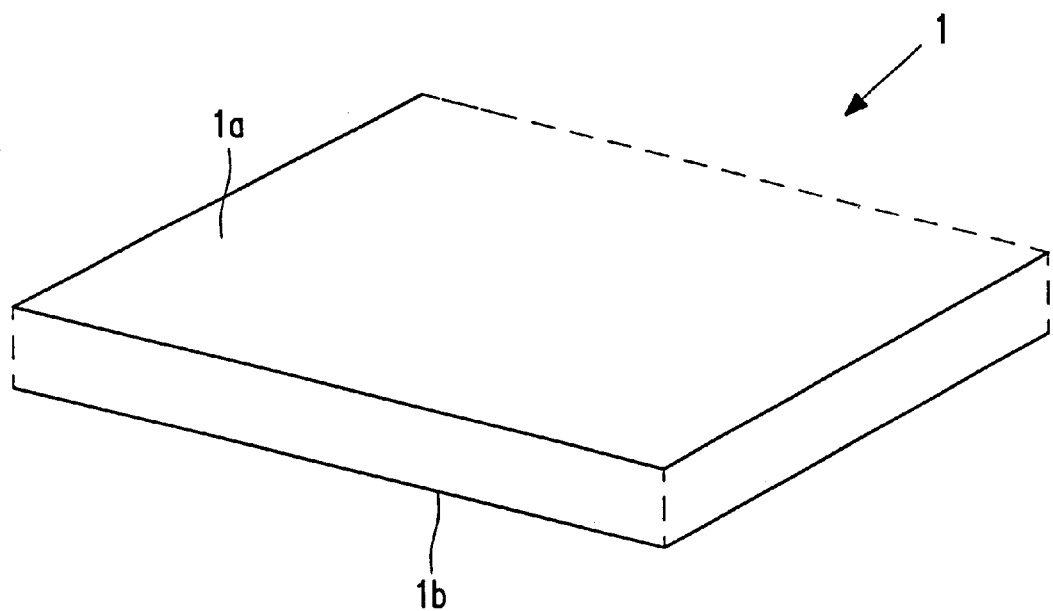
FIG. 1 renders a perspective view of a ceramic plate which can be employed in a particular embodiment of the method according to the invention.

FIG. 1 shows a flat ceramic plate 1 having first and second major surfaces 1a, 1b, respectively. The plate 1 is comprised, for example, of soda glass, and has a thickness of approximately 0.5 mm; its lateral dimensions are of the order of about 350×300 mm$^2$.

Figure 2:
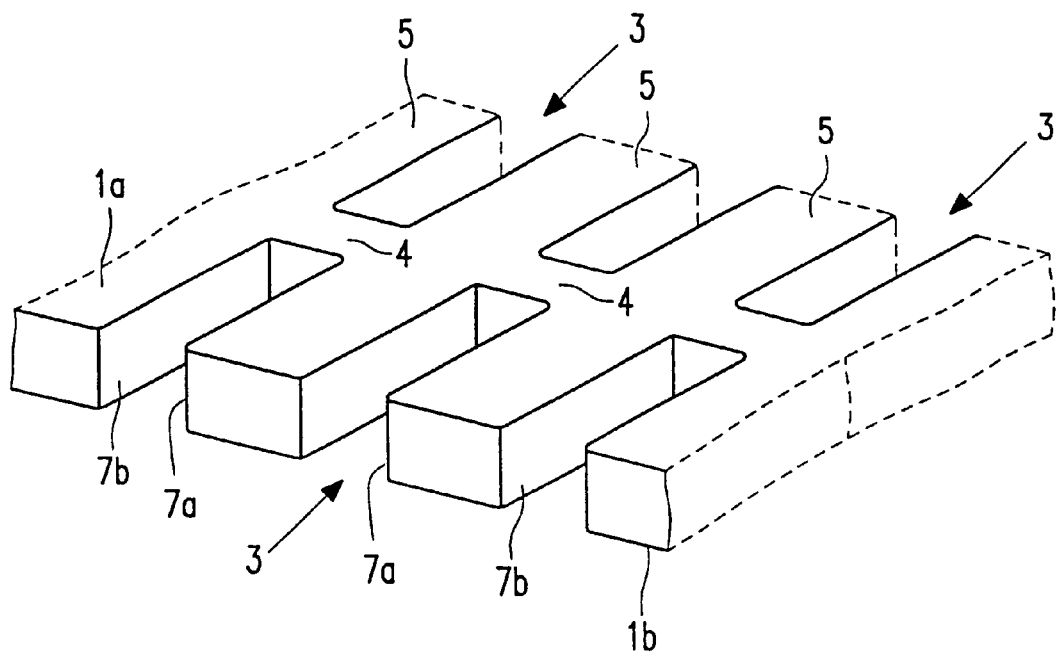
FIG. 2 shows the subject of FIG. 1 subsequent to the provision therein of slots as described in step (a)

In FIG. 2, the plate 1 has been subjected to a selective powder-blasting procedure. This has resulted in the creation of a series of mutually parallel slots 3 which extend from the first major surface 1a through to the second major surface 1b. These slots 3 serve to subdivide the substrate 1 into segments 5 extending parallel to the slots 3 and located between consecutive pairs thereof. Each segment 5 has two oppositely located walls 7a,7b extending along the edges of the adjacent slots 3. The plate 1 is kept intact by the presence of a series of connective bridges 4, which join adjacent segments 5 at regular intervals along their length. In this particular case, the segments 5 are 1.5 mm wide, and have a length of approximately 25 mm between consecutive bridges 4. The powder-blasting procedure may, for example, be performed as follows:
providing a glass plate 1, e.g. SCHOTT AF45;
laminating a resist sheet of ORDYL BF405 (TOKYO OHKA) onto the face 1a of the plate 1;
irradiating the resist sheet according to the desired pattern of slots 3, bridges 4 and segments 5;
developing the irradiated sheet, e.g. with Na$_2$CO$_3$, and then postbaking;
powder-blasting;
stripping the remaining portions of resist, e.g. with ethanol amine.

Figure 3A:
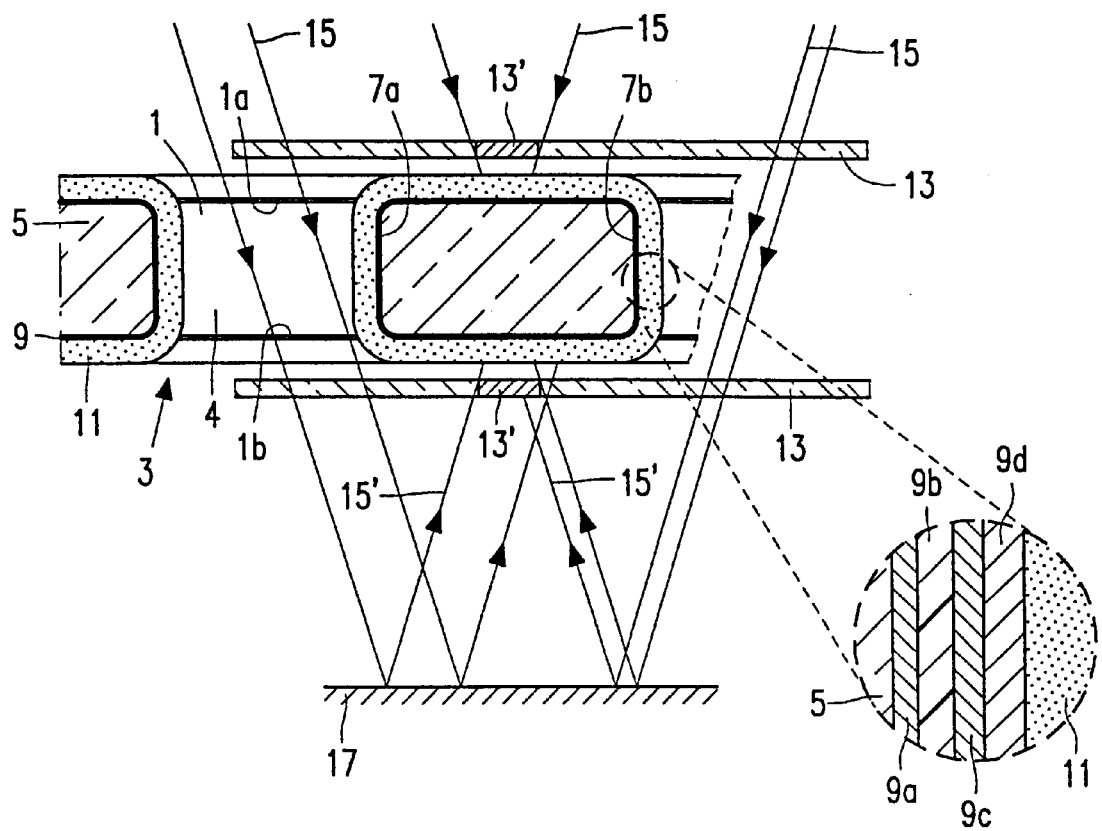
FIG. 3a renders a cross-sectional view of part of the subject of FIG. 2 after the provision thereupon of an electrode structure according to step (a), and illustrates step II of a three-dimensional lithographic procedure as referred to in step (b), whereby use is made of a positive resist.
Figure 3B:
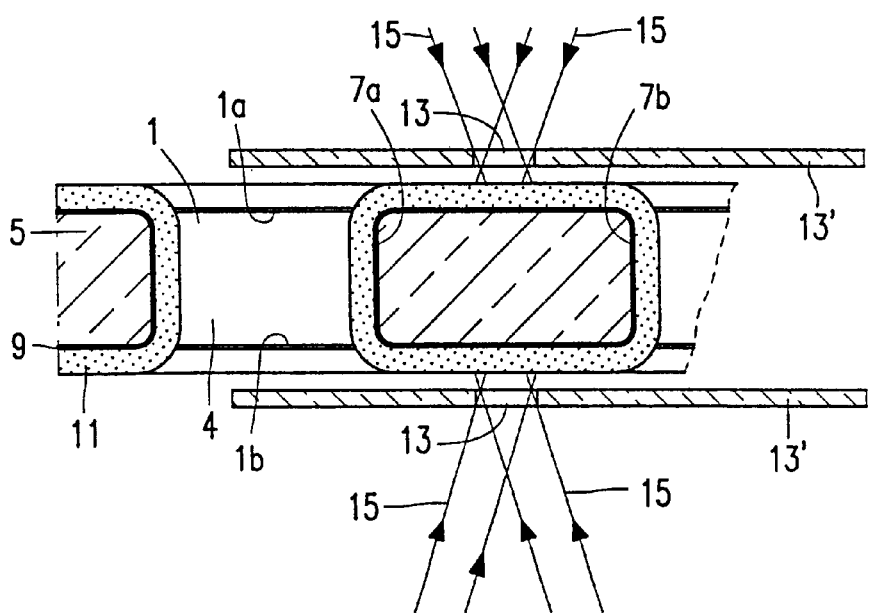
FIG. 3b corresponds broadly to FIG. 3a, except in that use is now made of a negative resist.

FIGS. 3a and 3b shows a cross-sectional view of the subject of FIG. 2. Each segment 5 has now been provided with an electrode structure 9 (step (a)). In this particular case, the structure 9 successively comprises:
an underlayer 9a of conductive material (e.g. 1 µm Al);
an intermediate layer 9b of insulating material (e.g. 0.5 µm Ta$_2$O$_5$ or Si$_3$N$_4$);
an overlayer 9c of conductive material (e.g. 1 µm Al),
each of these layers 9a, 9b, 9c being applied so as to cover substantially the entire surface of each segment 5. Layers 9a,9c can be applied using sputter deposition, whereas layer 9b may be applied using Chemical Vapor Deposition (CVD), for example. As here depicted, the layer 9c has been overlaid by a sputtered bilayer 9d comprising 0.1 µm Ti/1 µm Cu; this layer 9d will later serve to promote galvanic growth of the electrical contacts, i e. it acts as a plating base (see FIG. 5).

The electrode structure 9 has been covered by a layer 1 of photoresist (step (b), step I). This can, for example, be achieved by dipping the entire substrate 1 in a resist bath, or by spraying on the resist layer 11; alternatively, the layer 9d can be used as a plating base to electrophoretically apply a suitable resist.

In FIG. 3a, the resist layer 11 comprises a positive photoresist. The whole structure 1,5,9,11 is being irradiated using beams 15 of actinic radiation (e.g. UV light) from undepicted sources facing the first major surface 1a (step II). These sources are thus oriented that the beams 15 subtend an acute angle with the normal to the surface 1a; in this manner, the beams 15 are also directed towards the side walls 7a,7b. A reflective surface (mirror) 17 is located so as to face major surface 1b. Beams 15 incident upon this mirror 17 are reflected as beams 15' which impinge upon the surface 1b.

In this manner, a 3-dimensional irradiation is achieved. The irradiation occurs through a mask which contains transparent portions 13 and opaque portions 13', mutually positioned according to a desired pattern. As a result, not all portions of the layer 11 will be irradiated. As here depicted, a mask is employed on both sides of the substrate 1; however, in principle, this is unnecessary, and appropriate positioning of additional opaque portions 13' in the upper mask can remove the need for a separate lower mask.

In FIG. 3b, on the other hand, the resist layer 11 comprises a negative photoresist (e.g. SHIPLEY ED 2100, applied electrophoretically in a 30-second coating step at 100 V and 30° C., and then postbaked, resulting in a layer 11 with a thickness of about 10 μm). Once again, the whole structure 1,5,9,11 is being irradiated using angled beams 15 of actinic radiation from undepicted sources. However, in this case, the sources are located so as to face both the first and second major surface 1a,1b, and no use is made of a mirror 17. The irradiation occurs through a mask which contains transparent portions 13 and opaque portions 13', mutually positioned according to a desired pattern (which is the negative of the pattern in FIG. 3a).

The rest of this embodiment will be described on the basis of the scenario in FIG. 3b (negative photoresist).

Figure 4:
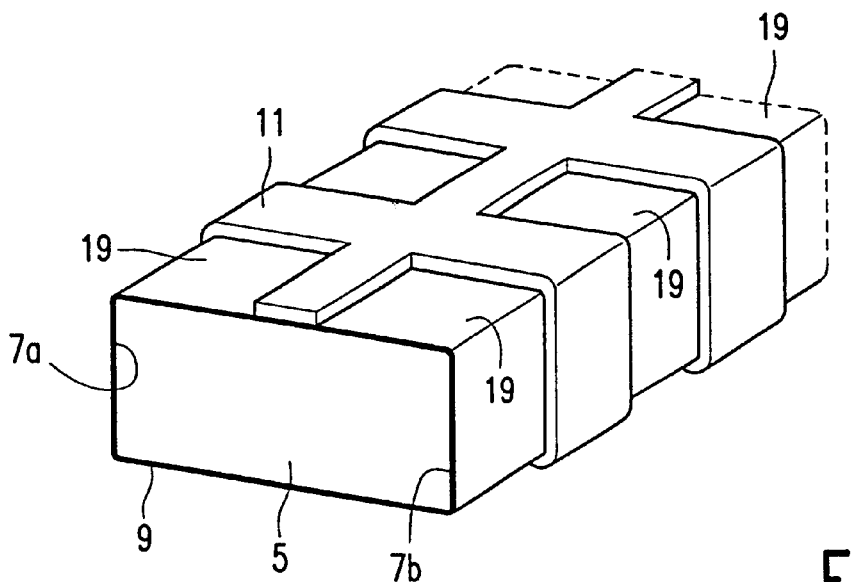
FIG. 4 renders a perspective view of part of the subject of FIG. 3b, subsequent to the removal of un-irradiated portions of photoresist according to step III.

FIG. 4 shows part of the subject of FIG. 3b. At this stage, regions of the resist layer 11 which were not irradiated in FIG. 3b have been dissolved away (step III), leaving only the irradiated portions behind; this can be done using a developer such as SHIPLEY 2005, for example. As a result, empty spaces 19 have been created atop the electrode structure 9. Using a galvanic procedure (on top of the seed layer 9d), electrical contacts will be grown in these empty spaces 19.

Figure 5:
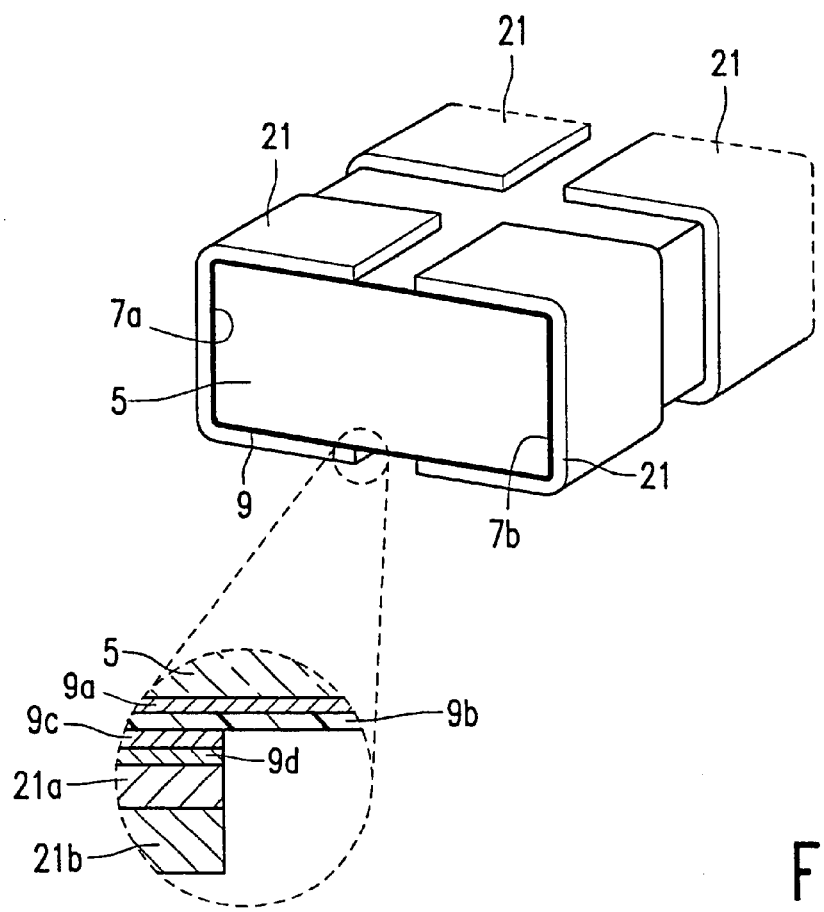
FIG. 5 shows the subject of FIG. 4, after the growth of contact electrodes thereupon according to step IV and the subsequent removal of irradiated portions of photoresist according to step V.

In FIG. 5, the electrical contacts 21 referred to in the previous paragraph have been grown (step IV). As here depicted, these contacts comprise a 10 μm layer 21a of Cu and a 10 μm layer 21b of $Pb_{40}Sn_{60}$. Furthermore, the irradiated resist portions 11 shown in FIG. 4 have been removed (step V), using a stripper such as acetone or SHIPLEY 2010, for example. In addition, exposed regions of the layers 9c and 9d (i.e. those regions not covered by contacts 21) have been removed, using the following etchants:

for the Cu in the layer 9d: $(NH_4S_2O_8$;
for the Ti in the layer 9d: $H_2O_2$;
for the layers 9a,9b,9c: $H_3PO_4/HAc/HNO_3$.

Figure 6:
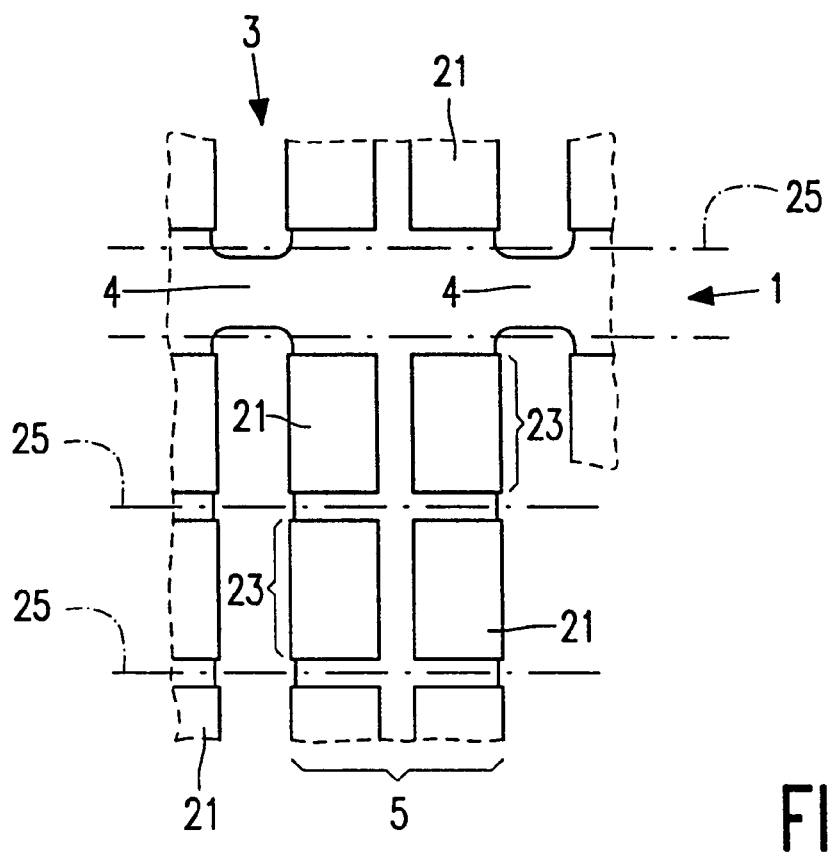
FIG. 6 shows an extended plan view of the subject of FIG. 5, and depicts a number of division lines along which the substrate will be severed.

FIG. 6 shows an expanded plan view of the subject of FIG. 5. It illustrates a matrix of individual block-shaped components 23 which may be separated from one another by severing the substrate 1 along the division lines 25. Such severing may, for example, be performed by sawing, dicing or running a laser beam along the lines 25. Each block-shaped component 23 thus obtained is a series-connected capacitor pair, in which:

the layer 9c on wall 7a is the first (free) electrode provided with a contact 21);
the layer 9c on wall 7a is the second (free) electrode (provided with a contact 21);
the layer 9a is the common electrode;
the layer 9b is the di electric layer.

Figure 7:
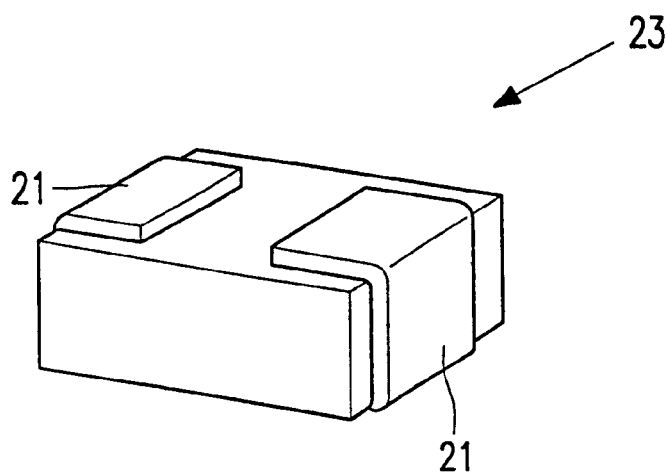
FIG. 7 gives a perspective view of a component resulting from the enaction of step (c) on the subject of FIG. 6.

FIG. 7 renders a perspective view of the finished component 23 with SMD-compatible electrical contacts 21.

Embodiment 2

In an embodiment otherwise identical to Embodiment 1, the electrode structure 9 in FIG. 3 is comprised only of the conductive layer 9a. The finished component 23 then serves as a thin-film resistor or fuse. The resistance of this component 23 is determined by:

the thickness of the layer 9a;
the resistivity of the material in the layer 9a;
the width of the layer 9a (in a direction parallel to the length of the segment 5);
the length of the layer 9a (between the terminating edges of the contacts 21 on opposite walls of the segment 5).

Embodiment 3

Figure 8:
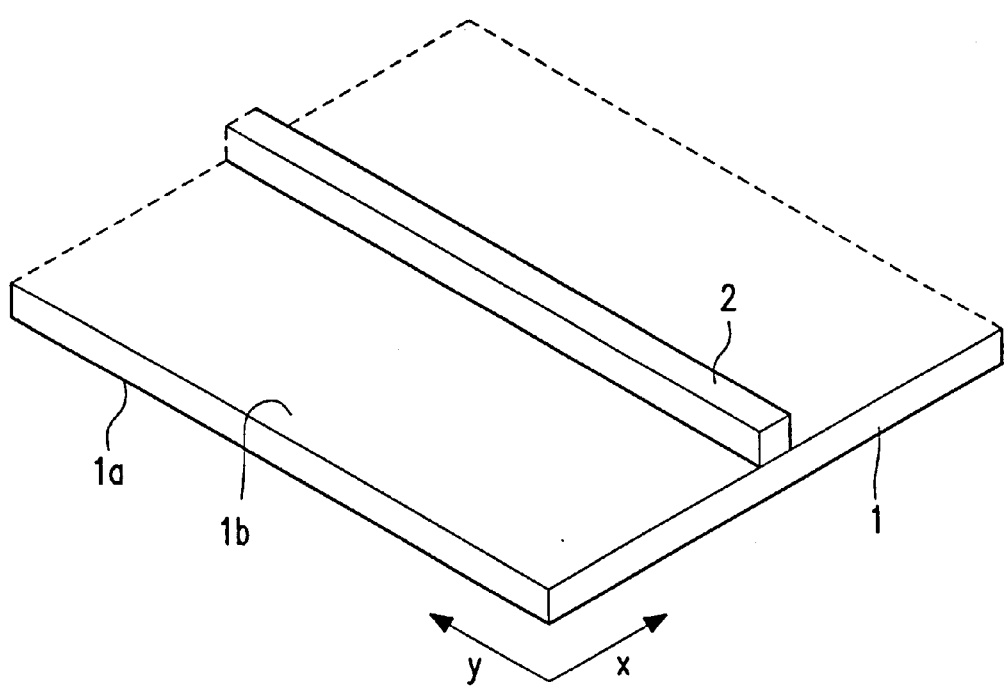
FIG. 8 renders a perspective view of a continuous ceramic plate to which a rigid support strip has been attached, which composite structure can be employed in another embodiment of the method according to the invention.
Figure 9:
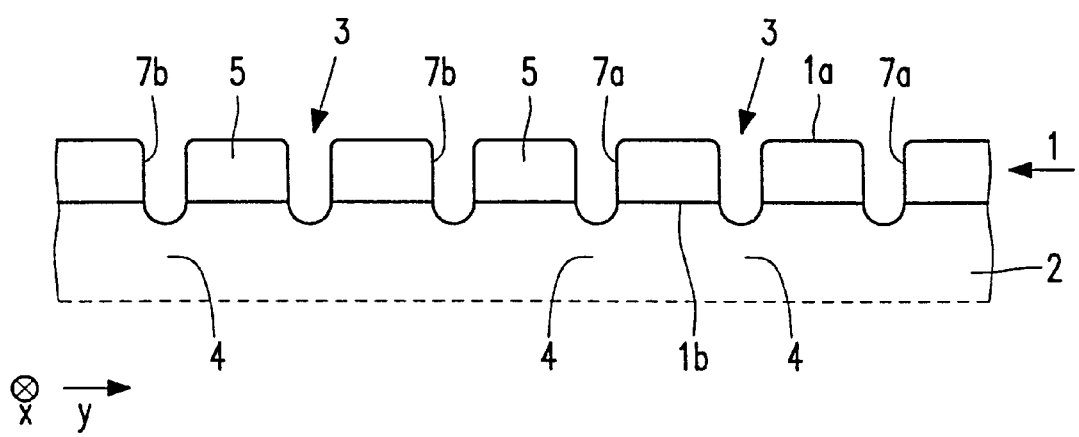
FIG. 9 shows an inverted elevation of the subject of FIG. 8, into which slots have now been cut so as to subdivide the plate into longitudinal segments as described in step (a), thus creating an alternative scenario to FIG. 2.

FIGS. 8 and 9 illustrate an embodiment of the method according to the invention, and represent alternatives to FIGS. 1 and 2.

FIG. 8 shows a continuous, flat ceramic plate 1 (on which an electrode structure may or may not already be present) onto which a rigid support strip 2 has been mounted. The strip 2 extends across the width of the plate 1 in the direction y. If so desired, additional such strips may be attached across the plate at further positions along the x-axis. The strip 2 may be comprised of aluminum or glass, for example. In this particular case, it has end-face dimensions of 5×5 mm². The strip 2 is attached to the major face 1b of the plate 1 using a proprietary adhesive.

FIG. 9 shows the subject of FIG. 8 in an inverted elevation, whereby the x-axis now extends into the plane of the Figure and the y-axis points to the right. In accordance with step (a) of the inventive method, slots 3 have been created in the x-direction, thereby subdividing the plate 1 into a series of parallel, longitudinal segments 5. Such slots 3 are created using a disc saw, wire saw or laser beam, for example.

Whereas the slots 3 extend right through the plate 1, they extend only partially into the support strip 2. As a result, portions 4 of the strip 2 remain intact, and act as bridges between the segments 5, ensuring that the segments remain attached together in a planar arrangement.

Embodiment 4

Figure 10:
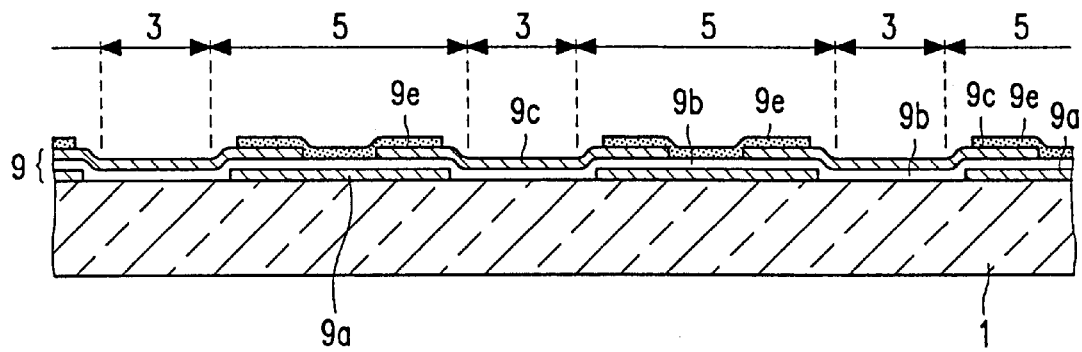
FIG. 10 gives a cross-sectional view of a continuous ceramic plate on which an electrode structure has been provided.
Figure 11:
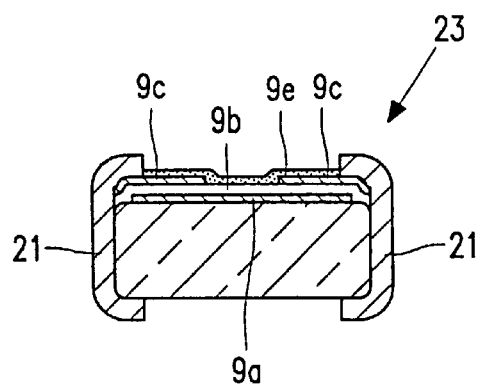
FIG. 11 shows an electrical component resulting from the enaction of the inventive method on the subject of FIG. 10.

FIGS. 10 and 11 relate to a particular embodiment of a method according to the invention.

In FIG. 10, a flat ceramic plate has been provided on one major face 1a with an electrode structure 9. This structure 9 comprises a conductive underlayer 9a, an intermediate dielectric layer 9b, and a conductive overlayer 9c. The layers 9a,9c are comprised of Ni or Al, for example, whereas the layer 9b is comprised of a material such as $Si_3N_4$, $SiO_2$ or $Al_2O_3$.

The layers 9a and 9c are provided using a technique such as sputter deposition or evaporation. The layers are not continuous, but instead comprise mutually separated islands which extend perpendicular to the plane of the figure. This may be achieved, for example:

by providing continuous layers, which are then selectively etched away to leave the said islands behind;
by depositing the islands directly through a mask.

The blanketing layer 9b is continuous, and is provided using a technique such as CVD or oxidic MBE.

Also depicted is a patterned protective layer 9e, which is in fact a bilayer comprising 0.5 μm SiN/10 μm polyimide; this layer 9e comprises islands which overlie the islands 9a.

The structure of FIG. 10 can be converted into a structure as specified in step (a) by creating slots 3 in the indicated positions, such slots 3 extending into the plane of the Figure. In this way, one creates a series of segments 5, which also extend into the plane of the Figure. Electrical contacts can then be provided on the side walls of such segments 5, in accordance with step (b) of the inventive method.

FIG. 11 shows the results of steps (b) and (c), when enacted on the structure of FIG. 10. The depicted component 23 is a series-connected capacitor pair. The electrical contacts 21 have been provided using a procedure as described in Embodiment 1.

Embodiment 5

Figure 12:
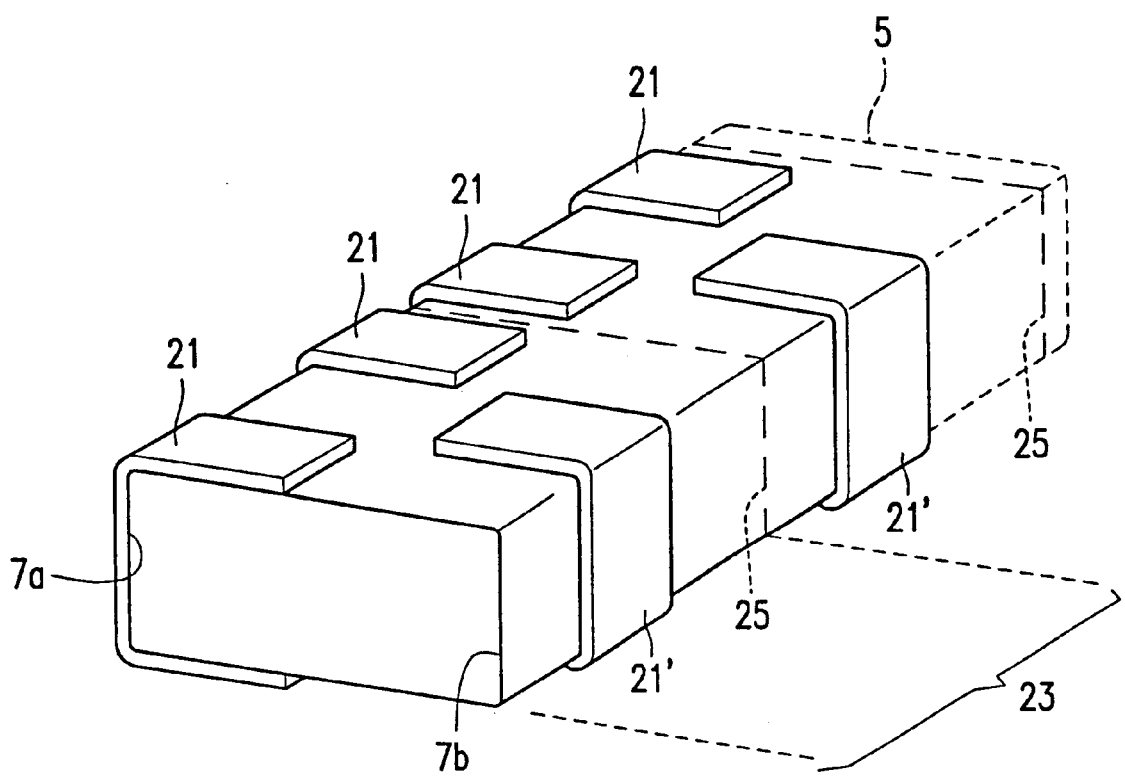
FIG. 12 corresponds broadly to FIG. 5, except in that it depicts a different arrangement of electrical contacts.

FIG. 12 corresponds broadly to FIG. 5, except in that it depicts an alternative arrangement of electrical contacts 21. In FIG. 12, the mutual spacing of the electrical contacts 21 along the wall 7a of the segment 5 is different to that of the electrical contacts 21' along the wall 7b. In particular, using the depicted division lines 25, it is possible to realize block-shaped components 23 having 3 terminals 21, 21, 21' per piece.

What is claimed is:

1. A method of manufacturing a plurality of thin-film, surface-mountable, electronic components, characterized in that it comprises the following successive steps:

a) providing a substantially planar ceramic substrate having a first and second major surface which are mutually parallel, and forming a series of mutually parallel slots in said substrate which extend from the first major surface through to the second major surface by attaching at least one rigid support strip across the width of said planar ceramic substrate, which comprises a continuous ceramic plate, and cutting slots through the ceramic plate which extend into but not through the rigid support strip, said slots serving to subdivide the substrate into elongated connected segments of the substrate extending parallel to the slots and located between consecutive pairs thereof, each segment having two oppositely located walls extending along the edges of the adjacent slots, and each segment carrying a thin-film electrode structure on at least one of its first and second major surfaces;

b) after providing said slots and with the aid of a lithographic technique, providing an electrical contact for each connected segment which extends along both walls of a respective segment and which makes electrical contact with the electrode structure on each respective segment; and c) severing the substrate into individual block-shaped components by severing the substrate along a series of division lines extending substantially perpendicular to the longitudinal direction of each segment.

2. The method according to claim 1, characterized in that the slots in step (a) are formed by powder-blasting said continuous ceramic plate.

3. The method according to claim 1, characterized in that the components are resistors, and that the electrode structure in step (a) is comprised of a single thin film of conductive material which extends between both walls of each segment.

4. The method according to claim 1, characterized in that the components are capacitors, and that the electrode structure in step (a) successively comprises:

an underlayer of conductive material which extends to a first wall of the oppositely located walls of each segment, but not a second wall;

a layer of insulating material which covers the underlayer;

an overlayer of conductive material which extends to the second wall of each segment, but not the first wall.

5. The method according to claim 1, characterized in that each component is a series-connected capacitor pair, and that the electrode structure in step (a) comprises:

an underlayer of conductive material;

an intermediate layer of insulating material;

an overlayer of conductive material, each of these layers being applied so as to cover substantially the entire surface of each segment.

6. The method according to claim 1, characterized in that each component is an inductor, and that the electrode structure in step (a) comprises:

an underlayer of conductive material, the layer having the form of a linear array of cells arranged in the longitudinal direction along each segment, each cell comprising a strip which is coiled into a spiral form, a first end of the strip extending to a first wall of the oppositely located walls of the segment and a second end of the strip lying in the middle of the spiral;

an intermediate layer of insulating material, the layer being provided with a via connection through to the second end of the strip in the underlayer;

an overlayer of conductive material, the layer having the form of a linear array of cells arranged in the longitudinal direction along each segment and in registry with the cells of the underlayer, each cell comprising a strip which runs from the via connection in the intermediate layer and to the second wall of the segment.

7. The method according to claim 1, characterized in that step (b) is performed using a method which comprises the following steps:

I. application of a curable photoresist to the substrate resulting from step (a);

II. selective curing of localized regions of photoresist, such curing being performed by irradiating the substrate from more than one side with actinic radiation, the irradiation occurring through a mask;

III. selectively dissolving away portions of resist, using an appropriate developer;

IV. providing a relatively thick metallic layer on all portions of the segments not covered by resist;

V. removing the remaining portions of resist, using an appropriate stripper.

8. The method according to claim 1, characterized in that the step (b) of providing an electrical contact comprises providing more than two electrical contacts.

* * * * *